United States Patent
Ohta et al.

(10) Patent No.: US 7,750,369 B2
(45) Date of Patent: Jul. 6, 2010

(54) NITRIDE SEMICONDUCTOR DEVICE

(75) Inventors: Hiroaki Ohta, Kyoto (JP); Hirotaka Otake, Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 202 days.

(21) Appl. No.: 12/213,005

(22) Filed: Jun. 12, 2008

(65) Prior Publication Data

US 2008/0315256 A1  Dec. 25, 2008

(30) Foreign Application Priority Data

Jun. 13, 2007  (JP) .............................. 2007-156458

(51) Int. Cl.
*H01L 21/02* (2006.01)
(52) U.S. Cl. ............................. 257/192; 257/76; 257/77; 257/94; 257/194; 257/E21.085; 257/E21.403; 257/E21.407; 257/E21.615; 257/E27.014; 257/E29.081; 257/E29.089; 257/E29.246
(58) Field of Classification Search ............. 257/76–94, 257/192–195, 615, E21.085, 403, 407, E27.014, 257/E29.081, 89, 246
See application file for complete search history.

(56) References Cited

U.S. PATENT DOCUMENTS

| | | | |
|---|---|---|---|
| 2005/0145883 A1* | 7/2005 | Beach et al. ................. 257/194 |
| 2006/0157733 A1* | 7/2006 | Lucovsky et al. ........... 257/192 |
| 2008/0128753 A1* | 6/2008 | Parikh et al. ................. 257/194 |
| 2008/0128862 A1* | 6/2008 | Sugimoto et al. ........... 257/615 |
| 2008/0169474 A1* | 7/2008 | Sheppard ...................... 257/76 |
| 2008/0237610 A1* | 10/2008 | Imanishi et al. ................ 257/77 |
| 2009/0039361 A1* | 2/2009 | Li et al. ......................... 257/94 |
| 2010/0012952 A1* | 1/2010 | Saxler et al. ................... 257/77 |
| 2010/0025730 A1* | 2/2010 | Heikman et al. ............. 257/194 |

FOREIGN PATENT DOCUMENTS

| JP | 5-047799 | 2/1993 |
|---|---|---|
| JP | 2007-096203 | 4/2007 |

* cited by examiner

Primary Examiner—Michael S Lebentritt
(74) Attorney, Agent, or Firm—Rabin & Berdo, P.C.

(57) ABSTRACT

A nitride semiconductor device according to the present invention includes: a nitride semiconductor laminated structure comprising a first layer made of a Group III nitride semiconductor, a second layer laminated on the first layer and made of an Al-containing Group III nitride semiconductor with a composition that differs from that of the first layer, the nitride semiconductor laminated structure comprising a stripe-like trench exposing a lamination boundary between the first layer and the second layer; a gate electrode formed to oppose the lamination boundary; and a source electrode and a drain electrode, having the gate electrode interposed therebetween, each connected electrically to the second layer.

9 Claims, 10 Drawing Sheets

NITRIDE SEMICONDUCTOR DEVICE

BACKGROUND OF THE INVENTION

1. Field of the Invention

The present invention relates to a nitride semiconductor device using a Group III nitride semiconductor.

2. Description of Related Art

An HEMT (High Electron Mobility Transistor) is conventionally known as a low-noise amplifying device to be equipped in an antenna for receiving satellite broadcast, a car navigation system, or the like.

An HEMT includes, for example, a Si substrate, an undoped GaN (gallium nitride) layer as an electron transit layer laminated on the Si substrate, and an n-type AlGaN (aluminum gallium nitride) layer as an electron supply layer laminated on the undoped GaN layer. Near an interface between the undoped GaN layer and the n-type AlGaN layer, a two-dimensional electron gas is formed inside the undoped GaN layer due to piezoelectric polarization resulting from a heterojunction between the undoped GaN layer and the n-type AlGaN layer. On the n-type AlGaN layer, a gate electrode is formed so as to form a Schottky junction with the n-type AlGaN layer. Also, on the n-type AlGaN layer, a source electrode and a drain electrode are formed to oppose each other with the gate electrode being interposed between the source electrode and the drain electrode. The source electrode and the drain electrode form ohmic contact with the n-type AlGaN layer. The source electrode and the drain electrode are thus electrically connected to the two-dimensional electron gas through the n-type AlGaN layer.

The HEMT having the above structure has a so-called normally-on characteristic such that even when a voltage is not applied to the gate electrode, conduction is provided between the source electrode and the drain electrode through the two-dimensional electron gas as long as there is a potential difference between the source and the drain. Thus, to put the HEMT in an off state, a negative voltage must be applied to the gate electrode to pinch off the two-dimensional electron gas. Attention is drawn to an HEMT of so-called normally-off characteristic such that the source-drain interval is put in an interrupted state even when a voltage is not applied to the gate electrode.

As an HEMT with a normally-off characteristic, an HEMT has been proposed that a portion of the electron supply layer at which the gate electrode is to be formed is formed thinly (for example, the corresponding location is made 20 nm in layer thickness) by recess etching. With this HEMT, even in the state in which a voltage is not applied to the gate electrode, the two-dimensional electron gas is pinched off by a depletion layer below the gate electrode (a depletion layer extending from the Schottky junction). A normally-off operation, in which the interval between the source electrode and the drain electrode is nonconductive is thus realized.

However, with the arrangement where the portion of the electron supply layer at which the gate electrode is formed is made thin in layer thickness, it is difficult to control a gate threshold voltage to a desired voltage value. For example, there are cases where the gate threshold voltage cannot be controlled to a voltage value of +1V or more.

SUMMARY OF THE INVENTION

An object of the present invention is to provide a nitride semiconductor device (HEMT) with which a normally-off operation can be realized and a desired gate threshold voltage can be realized.

A nitride semiconductor device according to one aspect of the present invention includes: a nitride semiconductor laminated structure comprising a first layer made of a Group III nitride semiconductor, a second layer, laminated on the first layer and made of an Al-containing Group III nitride semiconductor with a composition that differs from that of the first layer, the nitride semiconductor laminated structure comprising a stripe-like trench exposing a lamination boundary between the first layer and the second layer; a gate electrode formed to oppose the lamination boundary; and a source electrode and a drain electrode having the gate electrode interposed therebetween, each connected electrically to the second layer.

According to this configuration, the nitride semiconductor laminated structure is formed by laminating the first layer and the second layer. The stripe-like trench exposing the lamination boundary between the first layer and the second layer is formed in the nitride semiconductor laminated structure. By the forming of the stripe-like trench, a line-like portion exposing the lamination boundary at a side surface of the line-like portion is formed in the nitride semiconductor laminated structure. In the line-like portion, the gate electrode opposes the lamination boundary between the first layer and the second layer. The source electrode and the drain electrode having the gate electrode interposed therebetween, each connected electrically to the second layer. The first layer and the second layer are made of Group III nitride semiconductors (the second layer contains Al) that differ mutually in composition. A carrier, such as a two-dimensional electron gas, is thus formed inside the first layer near the lamination interface between the first layer and the second layer due to piezoelectric polarization resulting from a heterojunction between the first layer and the second layer. The nitride semiconductor device (HEMT: high electron mobility transistor) made of Group III nitride semiconductors is thus configured.

The Group III nitride semiconductors making the first layer and the second layer can generally be expressed as: $Al_w In_x Ga_{1-w-x} N$ ($0 \leq w \leq 1$, $0 \leq x \leq 1$ and $0 \leq w+x \leq 1$); and $Al_y In_z Ga_{1-y-z} N$ ($0 \leq y \leq 1$, $0 \leq z \leq 1$ and $0 \leq y+z \leq 1$); respectively. As the first layer, for example, GaN (gallium nitride) can be applied. To improve the carrier mobility, the first layer may be an intrinsic semiconductor that does not contain any dopants. Meanwhile, as the second layer, for example, AlGaN (aluminum gallium nitride) can be applied.

Because the gate electrode opposes the lamination boundary between the first layer and the second layer in the line-like portion, a depletion layer can be extended from the gate electrode to the lamination interface between the first layer and the second layer. As a result, even in a state where a potential difference is generated between the source and the drain and a voltage is not applied to the gate electrode, the two-dimensional electron gas (carrier) between the source and the drain can be pinched off by this depletion layer. A normally-off operation, in which the interval between the source and the drain is nonconductive when a voltage is not applied to the gate electrode, is thus realized.

Because the normally-off operation can be realized without having to control the layer thickness of the second layer, control of a gate threshold voltage is not restricted. Thus, with the present nitride semiconductor device, the desired gate threshold voltage can be realized by controlling to an appropriate value.

A plurality of the trenches may be formed in the nitride semiconductor laminated structure and in this case, an interval between mutually adjacent trenches is preferably 50 nm or less. By making the interval between adjacent trenches no more than 50 nm or less, the two-dimensional electron gas (carrier) between the source and the drain can be pinched off readily by the depletion layer extending from the gate electrode. More specifically, the depletion layer extending from the gate electrode reaches positions 25 nm from side surfaces of the line-like portion. Thus, when the interval between adjacent trenches, that is, the width of the line-like portion sandwiched by the adjacent trenches is 50 nm or less, the two-dimensional electron gas (carrier) can be pinched off readily by the depletion layer that extends to positions 25 nm from one side surface and the other side surface of the line-like portion, respectively.

The gate electrode may be formed to oppose the lamination boundary exposed in one side surface of the line-like portion or maybe formed to oppose the lamination boundary exposed in the other side surface of the line-like portion. The gate electrode may also be formed to oppose both the lamination boundary exposed in one side surface and the lamination boundary exposed in the other side surface. The gate electrode may also be formed to oppose either the lamination boundary exposed in one side surface or the lamination boundary exposed in the other side surface and a top surface of the line-like portion. Furthermore, the gate electrode may be formed to oppose all of the above, that is, the lamination boundary exposed in one side surface, the lamination boundary exposed in the other side surface, and the top surface. With this configuration, since the depletion layer can be extended from three surfaces (both side surfaces and the top surface) of the line-like portion, the two-dimensional electron gas (carrier) can be pinched off even more readily. Also, each side surface of the line-like portion (side surface of the trench) may be an inclined surface or a perpendicular surface to the lamination interface between the first layer and the second layer.

Preferably, an insulating film is interposed between the gate electrode and the nitride semiconductor laminated structure.

With this configuration, since the insulating film is interposed between the gate electrode and the nitride semiconductor laminated structure, the nitride semiconductor device type is a so-called MIS (Metal Insulator Semiconductor) type. In MIS type the nitride semiconductor device, since surface charges (interface charges) inside the nitride semiconductor laminated structure near an interface between the nitride semiconductor laminated structure and the insulating film can be suppressed, generation of a leak current can be suppressed. Since a trap level at a surface of the nitride semiconductor laminated structure can also be reduced by suppression of the surface charges (interface charges), current collapse can be suppressed.

The insulating film may be an SiN (silicon nitride) film, an $SiO_2$ (silicon oxide) film, an $Al_2O_3$ (aluminum oxide) film, an $HfO_2$ (hafniumoxide) film, or the like, and is preferably an SiN film in particular. When the insulating film is an SiN film, leak current generation and current collapse can be suppressed further.

A width of the trench in the stripe direction is preferably narrower than a width of the gate electrode in the stripe direction.

With this configuration, the width of the trench in the stripe direction of the trench is narrower than the gate electrode width (gate length) in the stripe direction of the trench. That is, in comparison of nitride semiconductor devices having the same gate length, a proportion of the nitride semiconductor laminated structure occupied by a portion at which a trench is not formed is larger than that in a configuration where the trench width is wider than the gate electrode width (gate length). As mentioned above, in the nitride semiconductor laminated structure, the two-dimensional electron gas (carrier) is formed inside the first layer near the lamination interface between the first layer and the second layer. Thus, the larger the proportion of the nitride semiconductor laminated structure occupied by the portion at which the trench is not formed, the larger the distribution range of the two-dimensional electron gas (carrier). By making the distribution range of the two-dimensional electron gas (carrier) large, the nitride semiconductor device can be reduced in on resistance and an even better HEMT can be realized.

A nitride semiconductor device according to another aspect of the present invention includes: a line like portion comprising a first layer made of a Group III nitride semiconductor, a second layer laminated on the first layer and made of an Al-containing Group III nitride semiconductor with a composition that differs from that of the first layer, a source electrode connection portion provided at one end of the line like portion, a drain electrode connection portion provided at the other end of the line like portion, a gate electrode provided for covering a part of the line like portion including at least a lamination boundary between the first layer and the second layer.

According to this configuration, the line like portion is formed by laminating the first layer and the second layer. The gate electrode opposes apart of the line like portion in the lamination boundary between the first layer and the second layer. The source electrode connection portion for connecting a source electrode is provided at one end of the line like portion. Meanwhile, The drain electrode connection portion for connecting a drain electrode is provided at other end of the line like portion. The first layer and the second layer are made of Group III nitride semiconductors (the second layer contains Al) that differ mutually in composition. A carrier, such as a two-dimensional electron gas, is thus formed inside the first layer near the lamination interface between the first layer and the second layer due to piezoelectric polarization resulting from a heterojunction between the first layer and the second layer. The nitride semiconductor device (HEMT: high electron mobility transistor) made of Group III nitride semiconductors is thus configured.

Because the gate electrode opposes the lamination boundary between the first layer and the second layer in the part of line-like portion, a depletion layer can be extended from the gate electrode to the lamination interface between the first layer and the second layer. As a result, even in a state where a potential difference is generated between the source and the drain and a voltage is not applied to the gate electrode, the two-dimensional electron gas (carrier) between the source and the drain can be pinched off by this depletion layer. A normally-off operation, in which the interval between the source and the drain is nonconductive when a voltage is not applied to the gate electrode, is thus realized.

Because the normally-off operation can be realized without having to control the layer thickness of the second layer, control of a gate threshold voltage is not restricted. Thus, with the present nitride semiconductor device, the desired gate threshold voltage can be realized by controlling to an appropriate value.

In the nitride semiconductor device, the width being orthogonal to the longitudinal direction of the line like portion is preferably 50 nm or less.

By making the width of the line like portion no more than 50 nm or less, the two-dimensional electron gas (carrier) between the source and the drain can be pinched off readily by the depletion layer extending from the gate electrode. More specifically, the depletion layer extending from the gate electrode reaches positions 25 nm from side surfaces of the line like portion. Thus, when the width of the line like portion is 50 nm or less, the two-dimensional electron gas (carrier) can be pinched off readily by the depletion layer that extends to positions 25 nm from one side surface and the other side surface of the line-like portion, respectively.

Preferably, an insulating film is interposed between the gate electrode and the line like portion.

With this configuration, since the insulating film is interposed between the gate electrode and the line like portion, the nitride semiconductor device type is a so-called MIS (Metal Insulator Semiconductor) type. In MIS type the nitride semiconductor device, since surface charges (interface charges) inside the line like portion near an interface between the line like portion and the insulating film can be suppressed, generation of a leak current can be suppressed. Since a trap level at a surface of the line like portion can also be reduced by suppression of the surface charges (interface charges), current collapse can be suppressed.

The line like portion can be a plurality of stripe-like line like portions in stripes. In this case, the source electrode connection portion is preferably a source-side merging portion spanning across the plurality of line-like portions along a width direction orthogonal to a longitudinal direction of the line like portions at one ends of the line like portions. The drain electrode connection portion is preferably a drain-side merging portion spanning across the line like portions along the width direction at other ends of the line like portions.

These and other objects, features and effects of the present invention will be more apparent from the following embodiments described with reference to the accompanying: drawings.

DETAILED DESCRIPTION OF THE INVENTION

Figure 1:
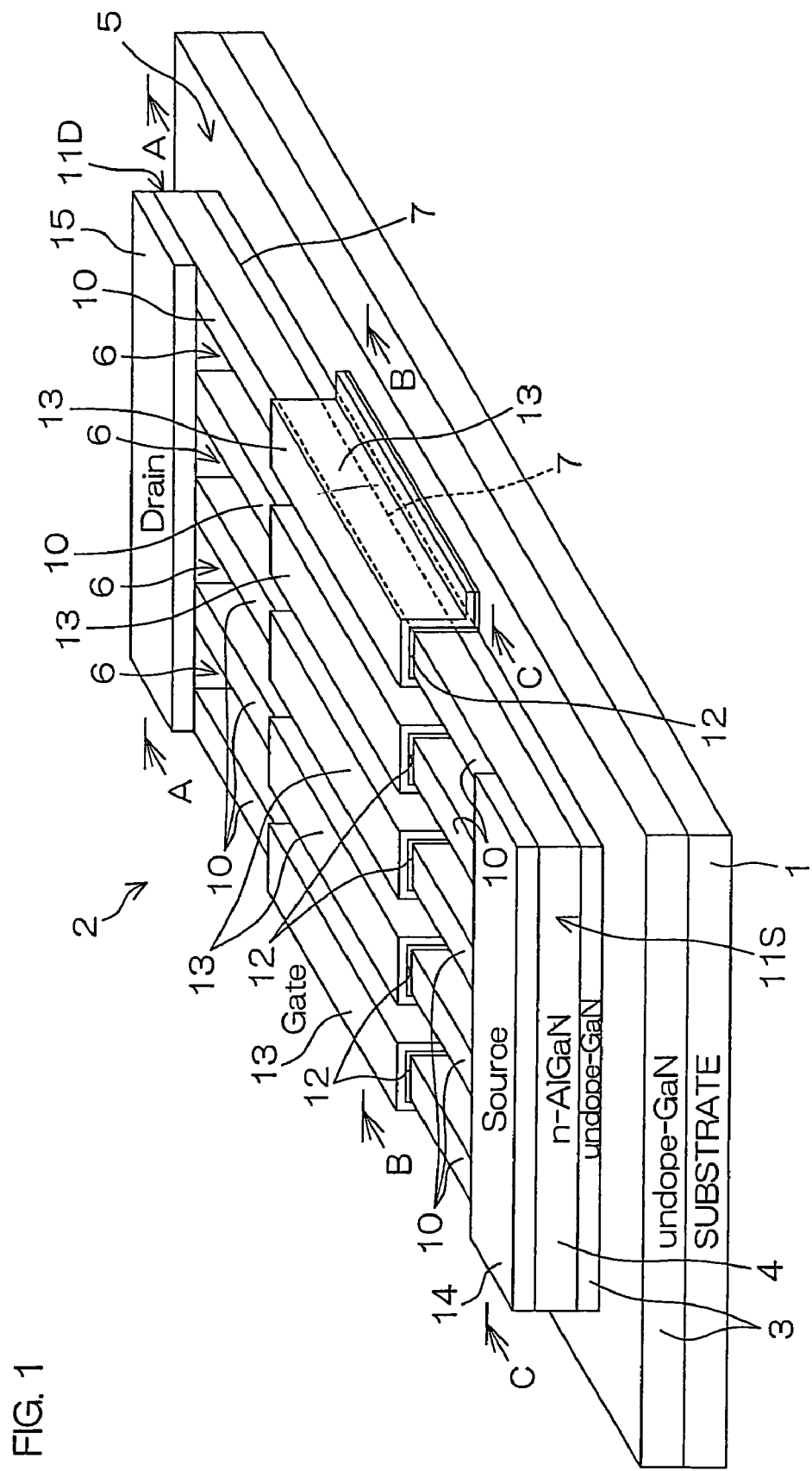
FIG. 1 is a diagrammatic perspective view for describing a structure of an HEMT according to a first embodiment of the present invention.
Figure 2A:
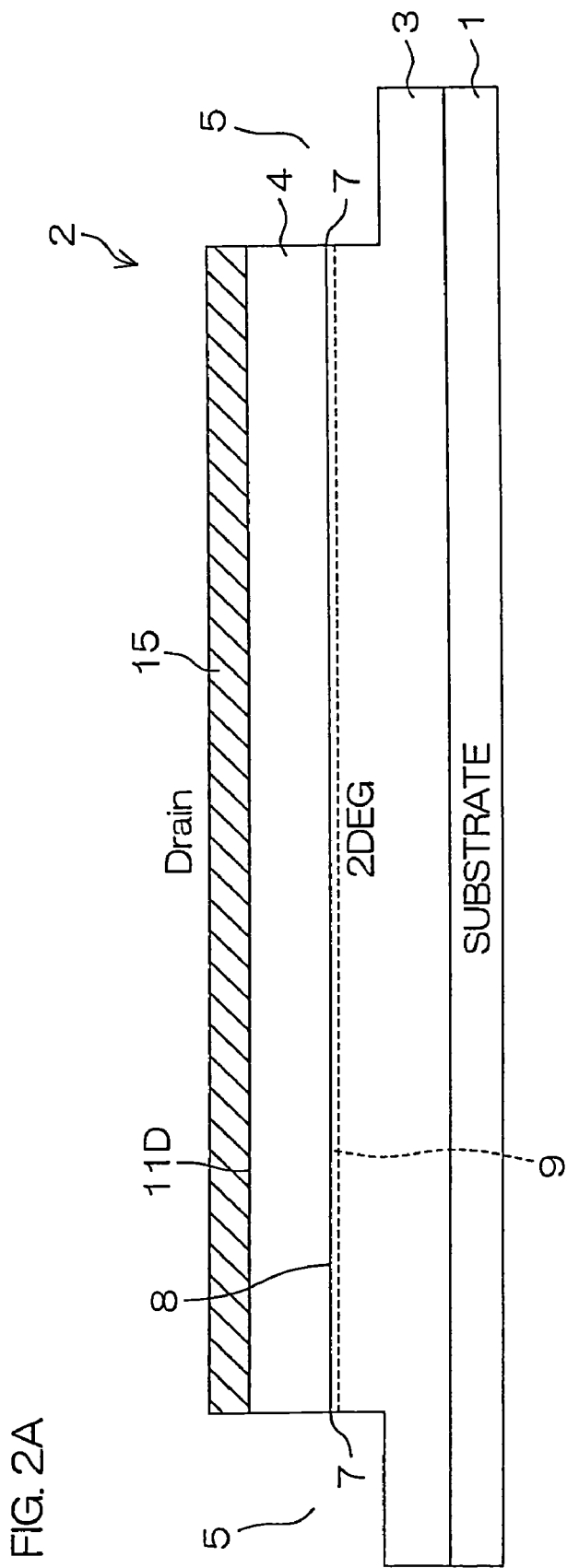
FIG. 2A is a cross-sectional view of the HEMT taken along a cutting line A-A shown in FIG. 1.
Figure 2B:
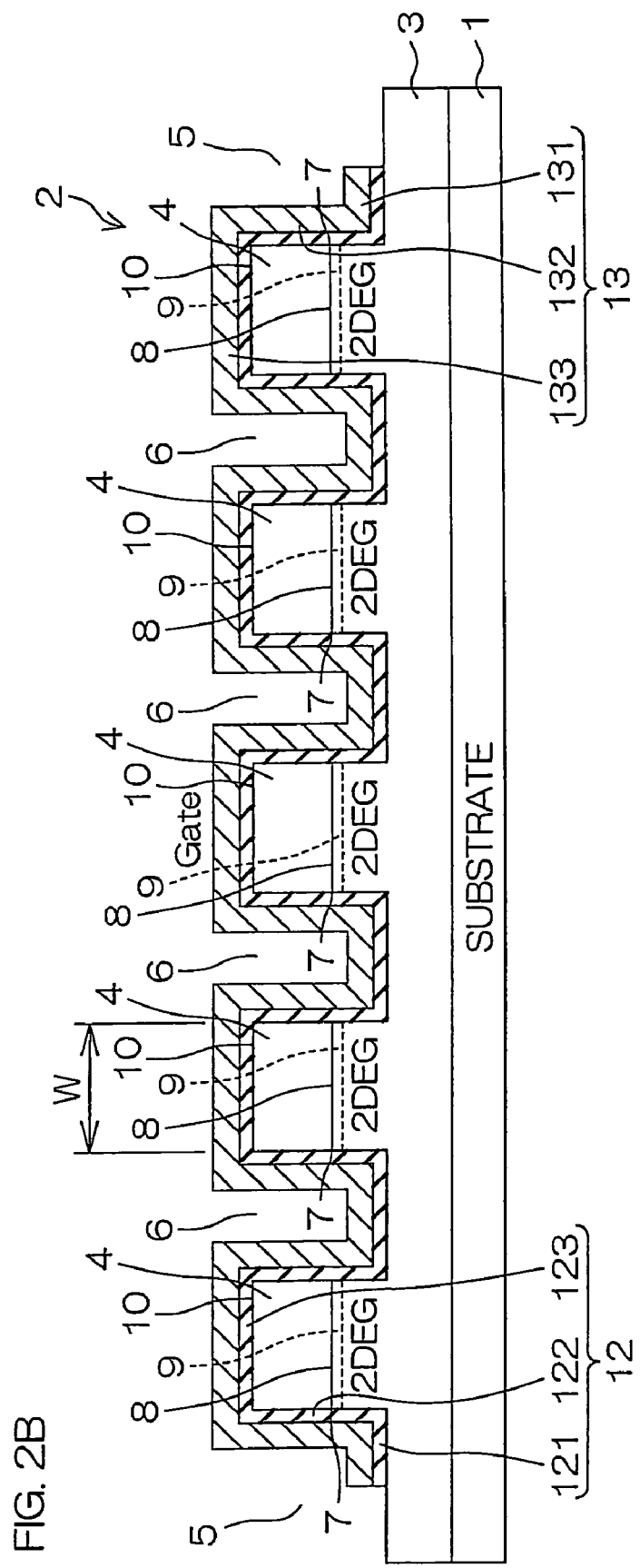
FIG. 2B is a cross-sectional view of the HEMT taken along a cutting line B-B shown in FIG. 1.
Figure 2C:
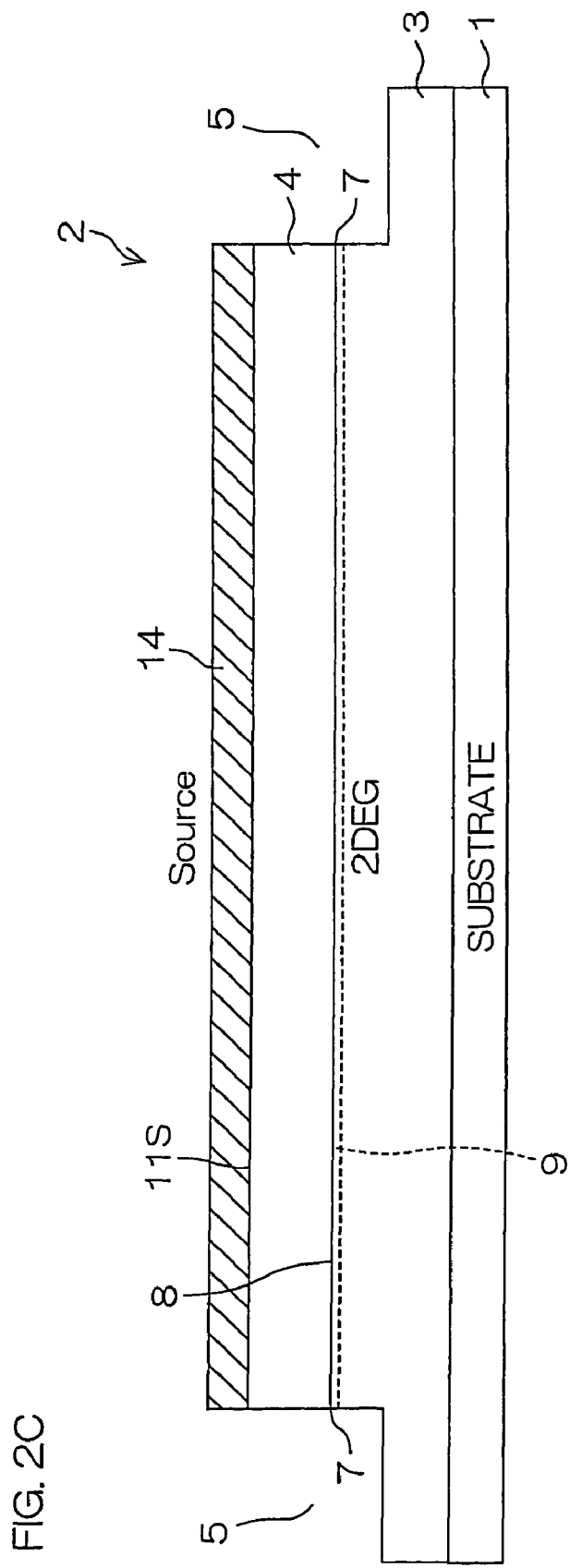
FIG. 2C is a cross-sectional view of the HEMT taken along a cutting line C-C shown in FIG. 1.

FIG. 1 is a diagrammatic perspective view for describing a structure of an HEMT according to a first embodiment of the present invention. FIG. 2A is a cross-sectional view of the HEMT taken along a cutting line A-A shown in FIG. 1. FIG. 2B is a cross-sectional view of the HEMT taken along a cutting line B-B shown in FIG. 1. FIG. 2C is a cross-sectional view of the HEMT taken along a cutting line C-C shown in FIG. 1.

The present HEMT (High Electron Mobility Transistor) is a semiconductor device used as a low-noise amplifying device equipped in an antenna for receiving satellite broadcast, a car navigation system, or the like. The HEMT includes a substrate 1 and a nitride semiconductor laminated structure 2, made of GaN compound semiconductor layers grown on the substrate 1.

As the substrate 1, an insulating substrate, such as a sapphire substrate, or a conductive substrate, such as a GaN substrate, ZnO substrate, Si substrate, GaAs substrate, SiC substrate can be applied. The nitride semiconductor laminated structure 2 includes an intrinsic (undoped) GaN layer 3 (first layer) formed in contact with the substrate 1, and an n-type AlGaN layer 4 (second layer) laminated on the intrinsic GaN layer 3. The GaN layer 3 has a layer thickness of, for example, 1 μm to several μm and the n-type AlGaN layer 4 has a layer thickness of, for example, 10 nm to 100 nm. The layer thickness of each layer refers to the layer thickness of a portion of the greatest layer thickness in each layer.

The nitride semiconductor laminated structure 2 is formed to have a rectangular shape as a whole. The nitride semiconductor laminated structure 2 has a plurality (five in FIG. 1) of mutually parallel (stripe-like) line-like portions 10 extending along a longitudinal direction (stripe direction) of the nitride semiconductor laminated structure 2, and island-like merging portions 11 (a source-side merging portion 11S and a drain-side merging portion 11D) each spanning across the plurality of line-like portions 10 along a width direction orthogonal to the longitudinal direction at respective ends of the line-like portions 10.

The plurality of line-like portions 10 are separated from each other by stripe-like trenches 6 formed between adjacent line-like portions 10. The merging portions 11 and the line-like portions 10 positioned at the respective sides, among the plurality of line-like portions 10, are surrounded by a trench 5 formed along a circumference of the nitride semiconductor laminated structure 2. Each line-like portion 10 has a length in the longitudinal direction (length in the longitudinal direction of the trench 6) of, for example, 10 μm to 500 μm, and each merging portion 11 has a length in the longitudinal direction of, for example, 10 μm to 100 μm.

The trench 5 and the trenches 6 are formed to a depth such that the intrinsic GaN layer 3 is exposed from the n-type AlGaN layer 4. Thus, at side walls of the respective line-like portions 10 and merging portions 11, a boundary between the intrinsic GaN layer 3 and the n-type AlGaN layer 4 is exposed as a lamination boundary 7. The trench 5 and the trenches 6 are formed so that an interval W in the width direction of the mutually adjacent trench 5 and trenches 6 (width orthogonal to the longitudinal direction of the line-like portion 10) is, for example, 50 nm or less and preferably 10 nm to 30 nm. Also in the present embodiment, the trench 5 and the trenches 6 are formed so that an angle of a side surface of each line-like portion 10 and each merging portion 11 to a lamination interface of the nitride semiconductor laminated structure 2 is, for example, 90°. The trench 5 and the trenches 6 may instead be formed to be inclined to the lamination interface of the nitride semiconductor laminated structure 2.

A gate insulating film 12 is formed at substantially central portions in the longitudinal direction of the line-like portion 10, the trench 5 and the trenches 6. The gate insulating film 12 includes insulating film bottom portions 121 covering bottom surfaces of the trenches 5 and 6, insulating film side portions 122 covering side surfaces of the line-like portions 10, and insulating film top portions 123 covering top surfaces of the line-like portions 10. In the present embodiment, the insulating film bottom portions 121, the insulating film side portions 122, and the insulating film top portions 123 are formed to continuously cover the top surfaces and the side surfaces of the line-like portions 10 and the bottom surfaces of the trenches 5 and 6. The gate insulating film 12 is formed so that its length in the longitudinal direction is narrower than the length in the longitudinal direction of the line-like portions 10 (length in the longitudinal direction of the trenches 6). Its length in the longitudinal direction is, for example, equal to a length in the longitudinal direction of a gate electrode 13 to be described below. The gate insulating film 12 may be formed to cover the entireties of the top surfaces and the side surfaces of the line-like portions 10 and the bottom surfaces of the trenches 5 and 6. The gate insulating film 12 has a film thickness of, for example, 1 nm to several nm. The gate insulating film 12 can be made, for example, of an SiN (silicon nitride) film, an $SiO_2$ (silicon oxide) film, an $Al_2O_3$ (aluminum oxide) film, an $HfO_2$ (hafnium oxide) film, or the like. In particular, when the gate insulating film 12 is made of an SiN film, leak current generation and current collapse in the HEMT can be suppressed.

The gate electrode 13 is formed on the gate insulating film 12. The gate electrode 13 is formed so that its length in the longitudinal direction is, for example, 0.1 µm to 10 µm. When the present HEMT is formed as a high frequency device, for example, the gate electrode 13 is formed so that its length in the longitudinal direction is about 0.1 µm.

The gate electrode 13 includes electrode bottom portions 131 formed on the insulating film bottom portions 121 and opposing the bottom surfaces of the trenches 5 and 6, electrode side portions 132 formed on the insulating film side portions 122 and opposing the side surfaces of the line-like portions 10, and electrode top portions 133 formed on the insulating film top portions 123 and opposing the top surfaces of the line-like portions 10. The gate insulating film 12 is thus interposed between the gate electrode 13 and the line-like portions 10, and the gate electrode 13 opposes the line-like portions 10 via the gate insulating film 12. The gate electrode 13 thus opposes the lamination boundary 7 via the gate insulating film 12. Also in the present embodiment, the electrode bottom portions 131, the electrode side portions 132, and the electrode top portions 133 are formed to continuously cover the entire surface of the gate insulating film 12. The gate electrode 13 can be made, for example, of Pt (platinum), Al (aluminum), Ni/Au (nickel/gold alloy), Ni/Ti/Au (nickel/titanium/gold alloy), Pd/Au (palladium/gold alloy), Pd/Ti/Au (palladium/titanium/gold alloy), Pd/Pt/Au (palladium/platinum/gold alloy), polysilicon, or other conductive material.

Inside the intrinsic GaN layer 3, a two-dimensional electron gas 9 (2DEG) is formed near semiconductor layer interface 8 between the intrinsic GaN layer 3 and the n-type AlGaN layer 4 (lamination interface of the first layer and the second layer). This two-dimensional electron gas 9 is formed due to piezoelectric polarization resulting from a heterojunction between the intrinsic GaN layer 3 and the n-type AlGaN layer 4. Two-dimensional electron gas 9 is present across substantially the entirety near the semiconductor layer interface 8 inside the intrinsic GaN layer 3 at the line-like portions 10 and the merging portions 11. A concentration of the two-dimensional electron gas 9 is, for example, approximately $10^{13}$ cm$^{-2}$ in a case where the Al composition in the n-type AlGaN layer 4 is 20%.

A source electrode 14 and a drain electrode 15 are formed in contact with the n-type AlGaN layer 4 at the source-side merging portion 11S and the drain-side merging portion 11D, respectively. The source electrode 14 and the drain electrode 15 are each formed to be substantially the same size in plan view as the corresponding merging portions 11. The source electrode 14 and the drain electrode 15 are formed to realize ohmic contact with the n-type AlGaN layer 4, and are electrically connected to the two-dimensional electron gas 9 via the n-type AlGaN layer 4. The source electrode 14 and the drain electrode 15 can each be configured as a laminated structure made, for example, of Ti/Al (lower layer/upper layer). In a case where the lower layers of the source electrode 14 and the drain electrode 15 are made of Ni, good ohmic contact with the n-type AlGaN layer 4 can be realized by heat alloying (annealing process) or the like.

Operation of the HEMT shall now be described.

To make the HEMT operate, first, a voltage is applied between the source electrode 14 and the drain electrode 15 such that the drain electrode 15 is positive. Electrons are thereby supplied from the n-type AlGaN layer 4 to the two-dimensional electron gas 9 at the source-side merging portion 11S. Electrons move to the drain electrode 15 in the longitudinal direction, and reach the drain electrode 15. Meanwhile with the present HEMT, because the electrode side portions 132 of the gate electrode 13 are formed to oppose both side surfaces of the respective line-like portions 10, and the electrode top portions 133 are formed to oppose the top surfaces of the line-like portions 10, a depletion layer extends from these three portions to the semiconductor layer interface 8. At the portions where the depletion layer has extended, the two-dimensional electron gas 9 disappears and the electrons supplied from the source electrode 14 cannot move to the drain electrode 15. The two-dimensional electron gas 9 is thus pinched off and between the source and the drain are nonconductive states. When in this state, a bias voltage of no less than a predetermined voltage value (gate threshold voltage) or more which is positive to a potential at the source electrode 14 as a reference potential is applied to the gate electrode 13, the two-dimensional electron gas 9 is formed at the line-like portions 10 and a channel is formed between the source and the drain. The electrons supplied from the source electrode 14 then move toward the drain electrode 15 via the two-dimensional electron gas 9 (channel) and between the source and the drain are conducted. Between the source and the drain are thus conducted when the bias voltage is applied to the gate electrode 13, and between the source and the drain are nonconductive when the bias voltage is not applied to the gate electrode 13. A normally-off operation is thus enabled.

FIGS. 3A to 3E are diagrammatic cross-sectional views showing a method for manufacturing the HEMT of FIG. 1 according to a sequence of steps and show a section taken along a broken cutting line B-C shown in FIG. 1.

Figure 3A:
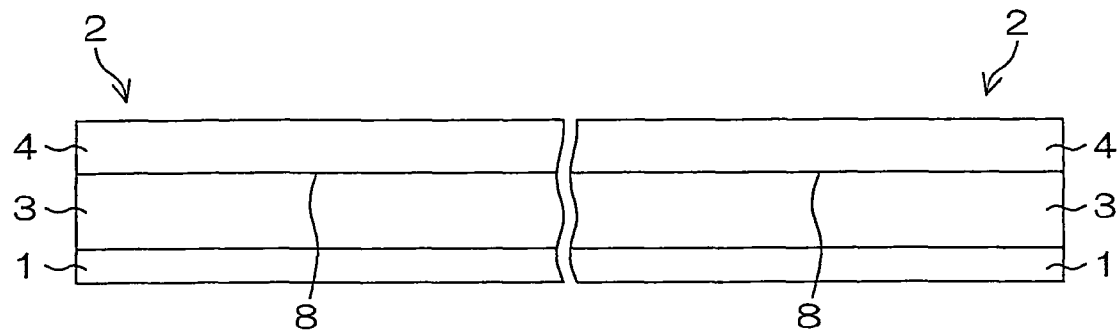
FIG. 3A is a diagrammatic cross-sectional view showing a method for manufacturing the HEMT of FIG. 1 according to a sequence of steps and shows a section taken along a broken cutting line B-C shown in FIG. 1.

To manufacture the HEMT, first, as shown in FIG. 3A, the intrinsic GaN layer 3 and the n-type AlGaN layer 4 are grown on the substrate 1, for example, by MOCVD growth with a c-plane (0001) as a principal growth plane. Thus, the nitride semiconductor laminated structure 2 having the c-plane (0001) as the lamination interface (semiconductor layer interface) 8 is formed on the substrate 1. As an n-type dopant used in growing the n-type AlGaN layer 4, for example, Si may be used.

Figure 3B:
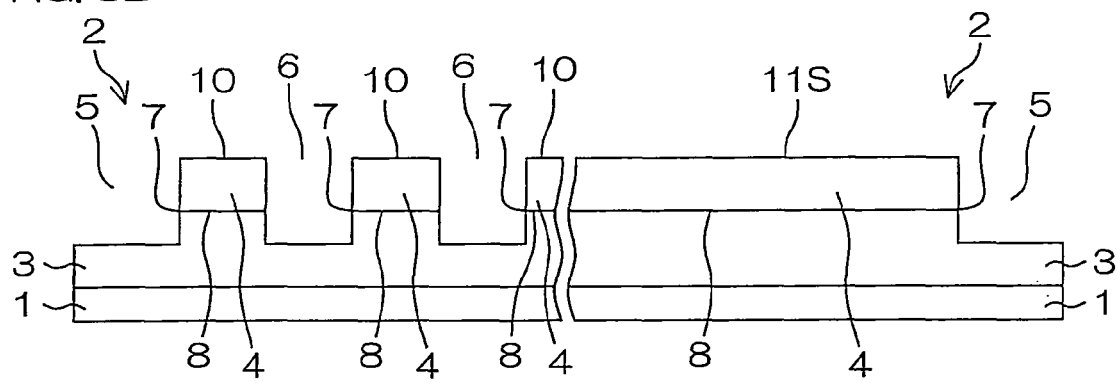
FIG. 3B is a diagram sectional view in a step subsequent that in FIG. 3A.

Next, the trench 5 and the trenches 6 are formed as shown in FIG. 3B. The trench 5 and the trenches 6 are formed, for example, by etching the nitride semiconductor laminated structure 2 to cut out wall surfaces with plane directions inclined in a range of 15° to 90° to the c-plane (0001). The etching is performed to a depth reaching an intermediate portion of the intrinsic GaN layer 3 from the n-type AlGaN layer 4.

More specifically for example, a photoresist is first coated onto the n-type AlGaN layer 4. Then, by a known nanoimprinting technique, a master mold having projecting portions of the same shape and pattern as the shapes of the trench 5 and the trenches 6 is pressed against the photoresist. The master mold is pressed having the projecting portions being matched in position with the regions where the trench 5 and the trenches 6 should be formed. And the photoresist is thereby patterned in a manner such that portions above the regions where the trench 5 and the trenches 6 should be formed are recessed. Thereafter, dry etching is performed using the photoresist as a mask. The n-type AlGaN layer 4 and the intrinsic GaN layer 3 are thereby etched along with the recessed portions of the photoresist and the trench 5 and the trenches 6 are formed. The dry etching is performed, for example, using a chlorine-based gas (for example, $Cl_2$, $BCl_2$, $C Cl_4$, $SiCl_4$, or the like.). By the forming of the trench 5 and the trenches 6, the boundary between the intrinsic GaN layer 3 and the n-type AlGaN layer 4 is exposed as the lamination boundary 7, and the line-like portions 10 and the merging portions 11 (only the source-side merging portion 11S is shown in FIG. 3B) are formed in the nitride semiconductor laminated structure 2.

Figure 3C:
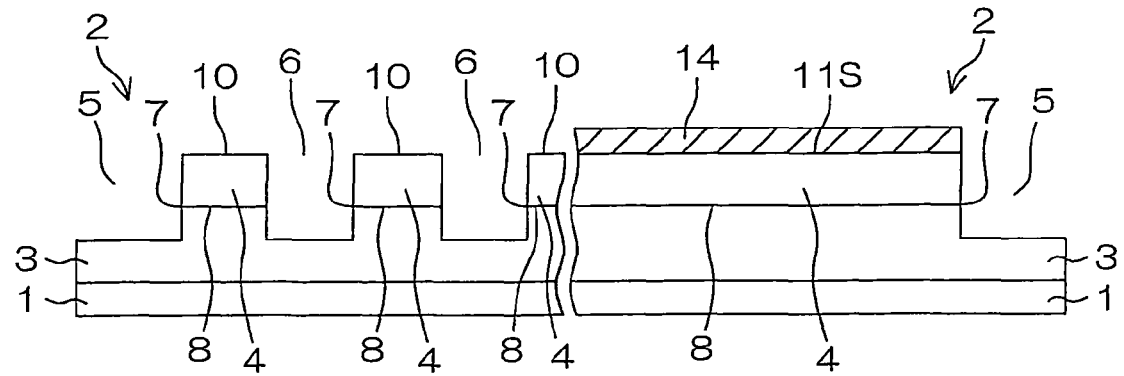
FIG. 3C is a diagram sectional view in a step subsequent that in FIG. 3B.

After the formation of the trench 5 and the trenches 6 according to a well-known photolithography technique, a photoresist (not shown) having an opening in a region where the source electrode 14 and the drain electrode 15 (see FIGS. 1 and 2A) should be formed is formed. The metals (for example, Ti and Al) used as the materials of the source electrode 14 and the drain electrode 15 are then sputtered in the order of Ti/Al from above the photoresist by a sputtering method. Thereafter, by removal of the photoresist, unnecessary part of the metal (part other than the source electrode 14 and the drain electrode 15) are lifted off together with the photoresist. By these operations, the source electrode 14 and the drain electrode 15 are formed in contact with the source-side merging portion 11S and the drain-side merging portion 11D, respectively, as shown in FIG. 3C. After the formation of the source electrode 14 and the drain electrode 15, the contacts of the source electrode 14 and the drain electrode 15 with the n-type AlGaN layer 4 are made ohmic contacts by heat alloying (annealing process).

Figure 3D:
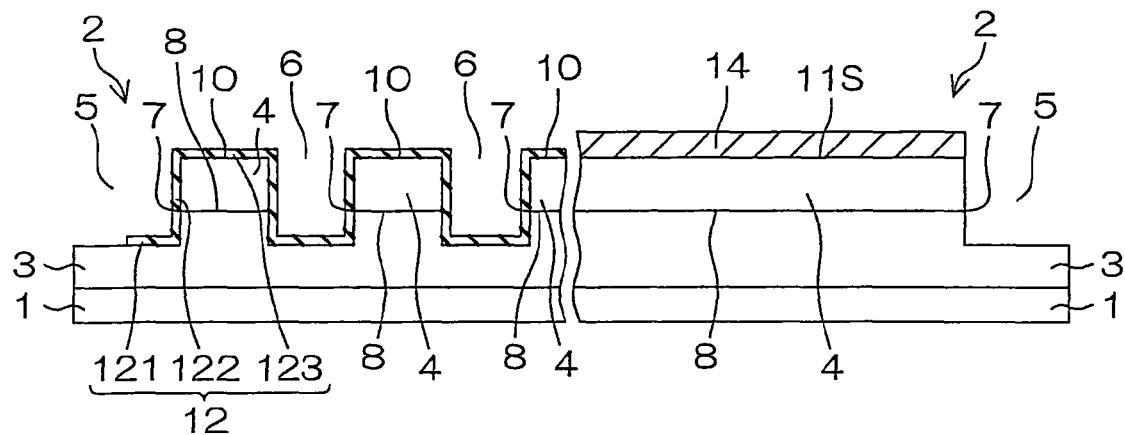
FIG. 3D is a diagram sectional view in a step subsequent that of FIG. 3C.

Next, as shown in FIG. 3D, the gate insulating film 12 is formed at the substantially central portions in the longitudinal direction of the line-like portions 10. The gate insulating film 12 is formed, for example, by ECR sputtering (Electron Cyclotron Resonance Sputtering) to cover the side surfaces and the top surfaces of the line-like portions 10 and the bottom surfaces of the trenches 6 continuously and reach the bottom surface of trench 5.

Figure 3E:
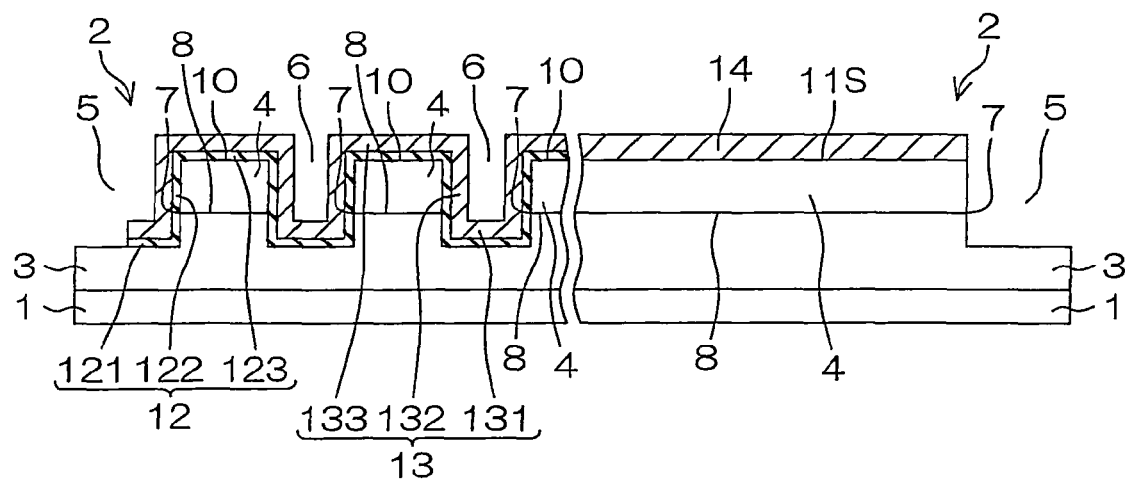
FIG. 3E is a diagram sectional view in a step subsequent that of FIG. 3D.

Thereafter, according to a well-known photolithography technique, a photoresist (not shown) having an opening in a region where the gate electrode 13 should be formed, is formed. The metal (for example, the abovementioned conductive material) used as the material of the gate electrode 13 is then sputtered from above the photoresist by a sputtering method. Thereafter, by removal of the photoresist, unnecessary part of the metal (part other than the gate electrode 13) is lifted off together with the photoresist. By these operations, the gate electrode 13 opposing the lamination boundary 7 via the gate insulating film 12 is formed as shown in FIG. 3E. The HEMT with the structure shown in FIG. 1 can thus be provided. Since the two-dimensional electron gas 9 is formed due to the piezoelectric polarization resulting from the heterojunction between the intrinsic GaN layer 3 and the n-type AlGaN layer 4, description thereof is omitted from the manufacturing steps shown in FIGS. 3A to 3E.

As described above, according to the embodiment, because the electrode side portions 132 of the gate electrode 13 oppose the lamination boundary 7 between the intrinsic GaN layer 3 and the n-type AlGaN layer 4, the depletion layer can be extended from the electrode side portions 132 to the semiconductor layer interface 8. The two-dimensional electron gas 9 can thus be pinched off by the depletion layer even in the state where a potential difference is generated between the source and the drain and a voltage is not applied to the gate electrode 13. Consequently, the normally-off operation is realized. Also, because the normally-off operation is realized without having to control the layer thickness of the n-type AlGaN layer 4, control of the gate threshold voltage of the HEMT is not restricted. Thus, according to the present HEMT, a desired gate threshold voltage can be realized by control to an appropriate value. The layer thickness of the n-type AlGaN layer 4 is not restricted to the layer thickness indicated as an example and may be even thinner according to the value of the gate threshold voltage.

Furthermore according to the HEMT, because the width W of each line-like portion 10 (the interval between mutually adjacent trenches 5 and 6) is 50 nm or less and preferably 10 nm to 30 nm, the two-dimensional electron gas 9 can be pinched off readily by the depletion layer extending from the gate electrode 13 (electrode side portions 132). More specifically, the depletion layer extending from the gate electrode 13 (electrode side portions 132) reaches, for example, positions 25 nm from the side surfaces of the line-like portions 10. Thus, when the width of each line-like portion 10 is 50 nm or less, the two-dimensional electron gas 9 can be pinched off readily by the depletion layer that extends to positions 25 nm from both side surfaces of the line-like portions 10. In particular according to the present HEMT, in addition to the electrode side portions 132, the electrode top portions 133 are formed opposite the top surfaces of the line-like portions 10. Thus, by controlling the layer thickness of the n-type AlGaN layer 4 to an appropriate value (for example, no more than 25 nm), the depletion layer reaching the two-dimensional electron gas 9 from the electrode top portion 133 can be extended. The two-dimensional electron gas 9 can thus be pinched off even more readily.

Also, because the gate insulating film 12 is interposed between the gate electrode 13 and the nitride semiconductor laminated structure 2, the HEMT type is a so-called MIS (Metal Insulator Semiconductor) type. Surface charges (interface charges) inside the nitride semiconductor laminated structure 2 near an interface between the nitride semiconductor laminated structure 2 and the gate insulating film 12 can thus be suppressed and generation of a leak current can be suppressed. Because a trap level at a surface of the nitride semiconductor laminated structure 2 can also be reduced by suppression of the surface charges (interface charges), current collapse can be suppressed.

Figure 4:
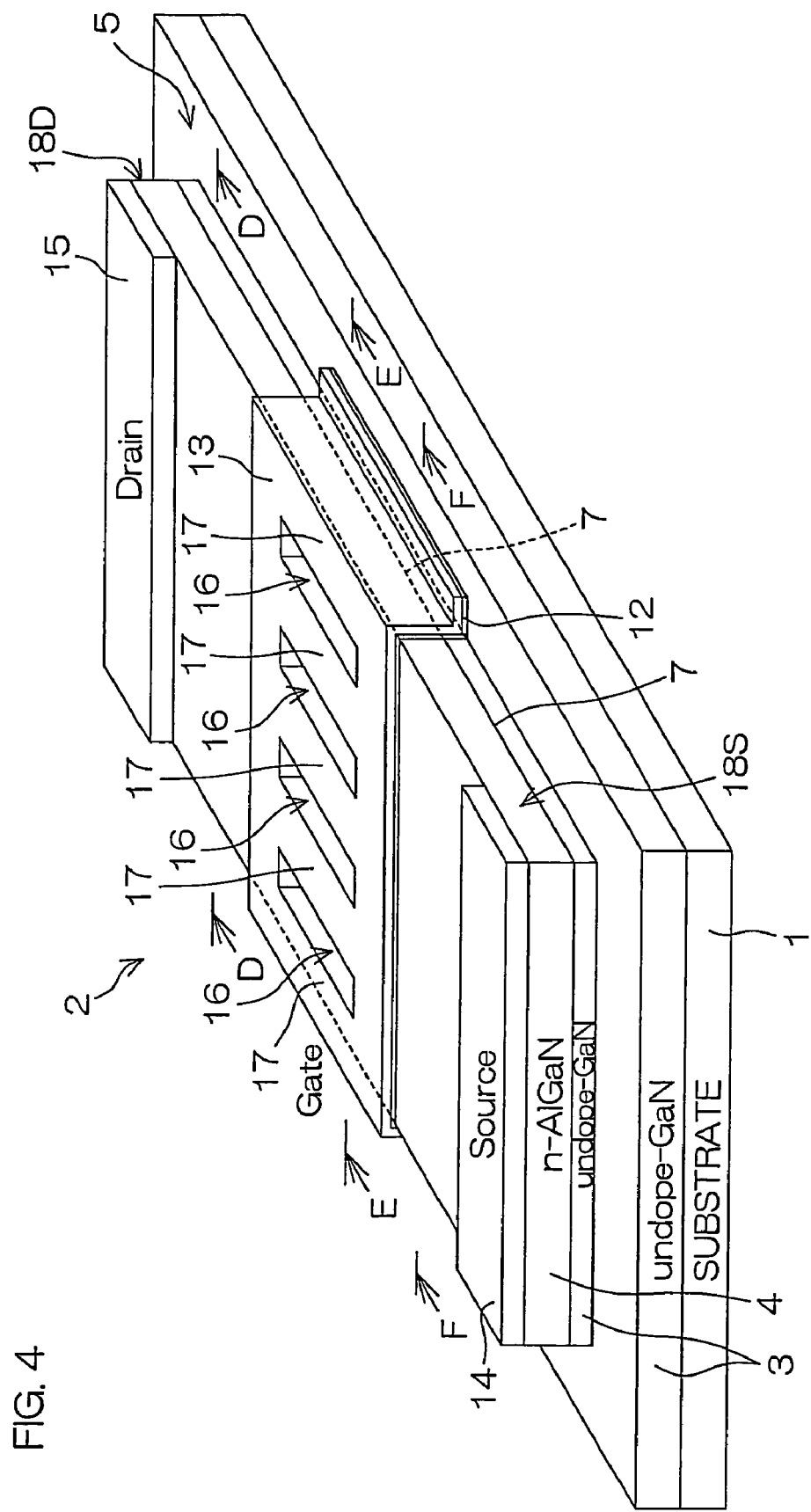
FIG. 4 is a diagrammatic perspective view for describing a structure of an HEMT according to a second embodiment of the present invention.
Figure 5A:
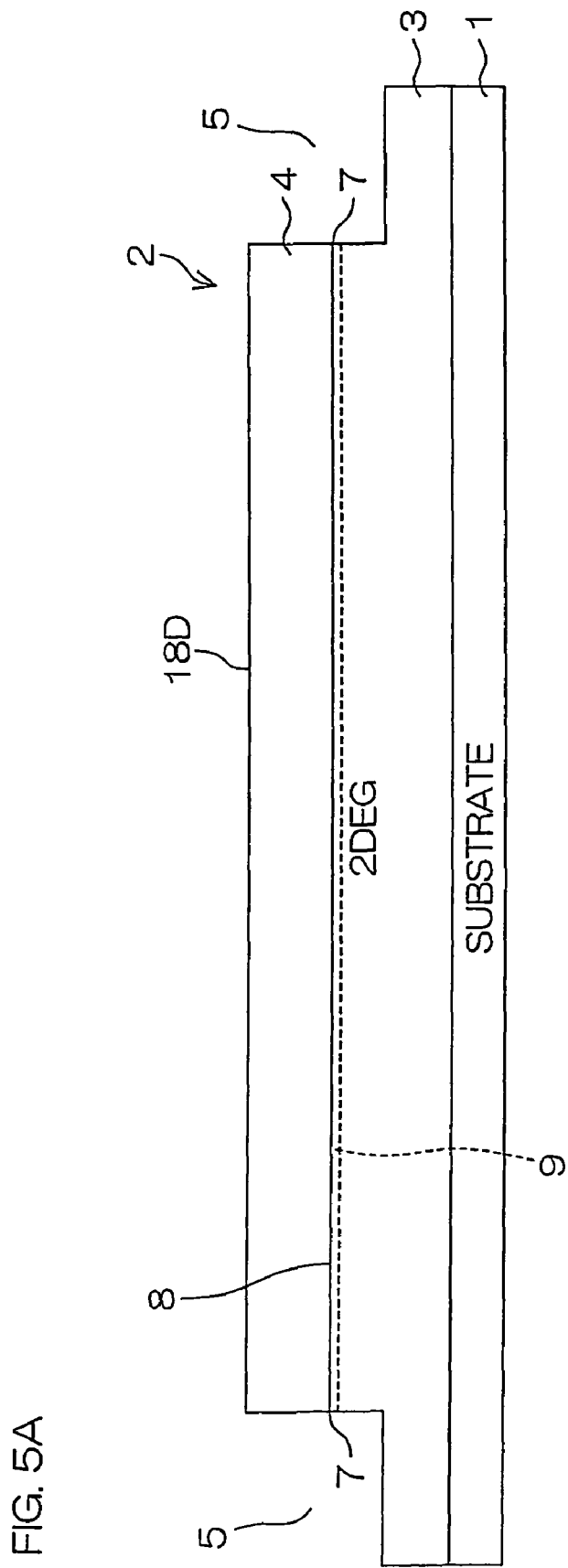
FIG. 5A is a cross-sectional view of the HEMT taken along a cutting line D-D shown in FIG. 4.
Figure 5B:
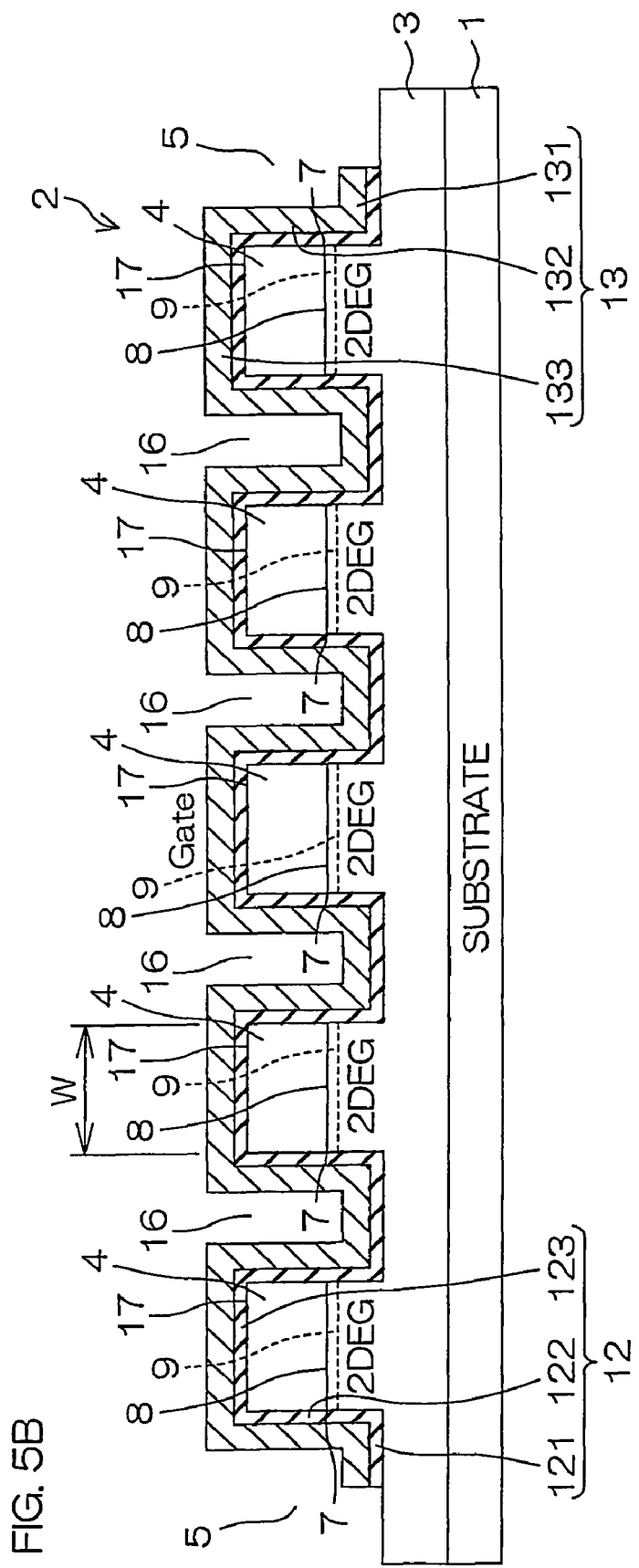
FIG. 5B is a cross-sectional view of the HEMT taken along a cutting line E-E shown in FIG. 4.
Figure 5C:
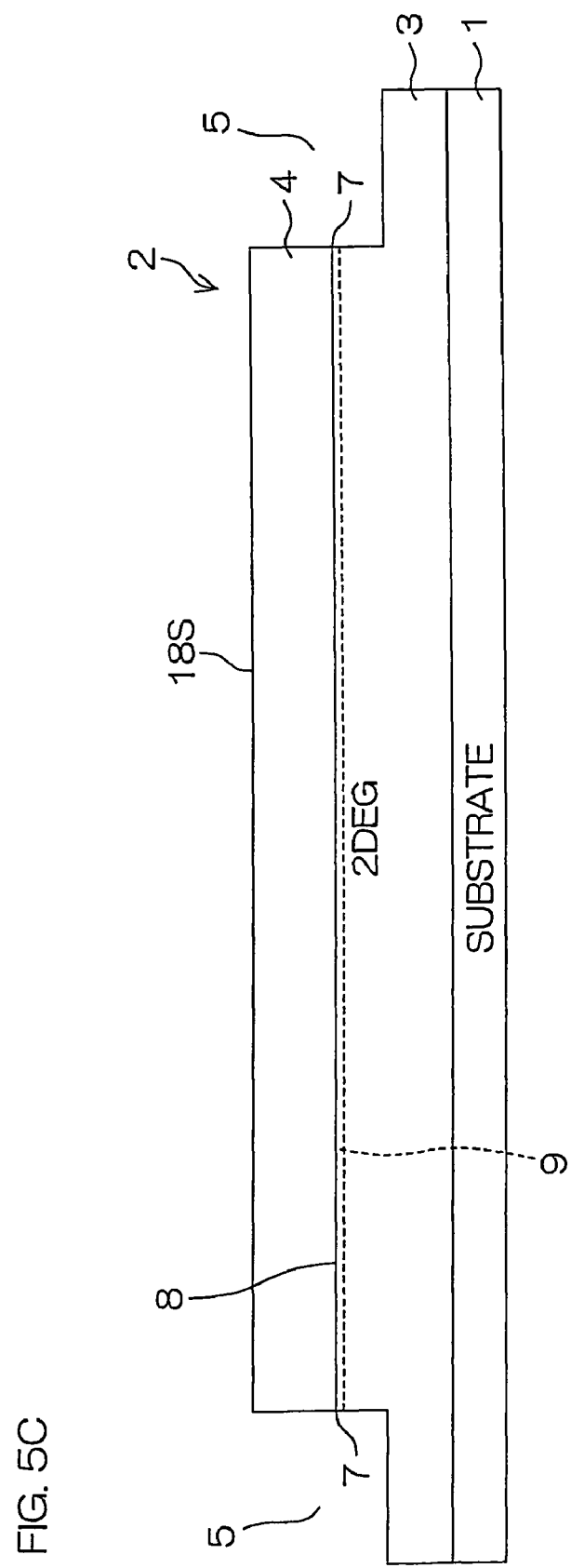
FIG. 5C is a sectional view of the HEMT taken along a cutting line F-F shown in FIG. 4.

FIG. 4 is a diagrammatic perspective view for describing a structure of an HEMT according to a second embodiment of the present invention. FIG. 5A is a cross-sectional view of the HEMT taken along a cutting line D-D shown in FIG. 4. FIG. 5B is a cross-sectional view of the HEMT taken along a cutting line E-E shown in FIG. 4. FIG. 5C is a cross-sectional view of the HEMT taken along a cutting line F-F shown in FIG. 4. In FIGS. 4 and 5A to 5C, parts corresponding to those in preceding FIGS. 1 and 2A to 2C are designated by the same reference numerals as those in FIGS. 1 and 2A to 2C.

In this embodiment, the nitride semiconductor laminated structure 2 is formed to be a rectangular shape as a whole. The nitride semiconductor laminated structure 2 has a plurality (five in FIG. 4) of mutually parallel line-like portions 17 extending along a longitudinal direction of the nitride semiconductor laminated structure 2, and island-like merging portions 18 (a source-side merging portion 18S and a drain-side merging portion 18D) respectively spanning across the plurality of line-like portions 17 along a width direction orthogonal to the longitudinal direction at respective ends of the line-like portions 17.

The plurality of line-like portions 17 are separated from each other by stripe-like trenches 16 formed between adjacent line-like portions 17. The merging portions 18 and the line-like portions 17 are positioned at the respective ends, among the plurality of line-like portions 17, are surrounded by the trench 5 formed along the circumference of the nitride semiconductor laminated structure 2. Each line-like portion 17 has a length in the longitudinal direction (length in the longitudinal direction of the trench 16) of, for example, 0.1 μm to 10 μm, and each merging portion 18 has a length in the longitudinal direction of, for example, 10 μm to 100 μm. The proportion of the entire nitride semiconductor laminated structure 2 occupied by the merging portions 18 is thus larger than the proportion of the entire nitride semiconductor laminated structure 2 occupied by the merging portions 11 in the first embodiment.

The gate insulating film 12 is formed at substantially central portions in the longitudinal direction of the line-like portions 17, the merging portions 18, the trench 5, and the trenches 16. The gate insulating film 12 is formed so that its length in the longitudinal direction is longer than the length in the longitudinal direction of the line-like portions 17 (length in the longitudinal direction of the trenches 16). The gate insulating film 12 is formed to cover surfaces of the line-like portions 17 and the trenches 16 continuously, cover peripheral portions of the line-like portions 17 and the trenches 16 at surfaces of the merging portions 18, and reach the bottom surface of the trench 5.

The source electrode 14 and the drain electrode 15 are formed in contact with the n-type AlGaN layer 4 at the source side merging portion 18S and the drain side merging portion 18D, respectively. The source electrode 14 and the drain electrode 15 are each formed to be smaller in plan view than the corresponding merging portions 18. The source electrode 14 and the drain electrode 15 are each located in ends of the corresponding merging portions 18 at sides opposite the sides at which the trenches 16 are formed. In the longitudinal direction other parts have the same arrangement as those of the first embodiment described above.

The HEMT according to the second embodiment can be manufactured by a method similar to the method described with reference to FIG. 3. That is, in the step described with reference to FIG. 3B, the trenches 16 of shorter length in the longitudinal direction than the trenches 6 are formed instead.

The same operation as that enabled by the HEMT according to the first embodiment can be performed and the same effects as the field-effect transistor according to the first embodiment can be obtained with the HEMT according to the second embodiment as well. In particular, according to the second embodiment the proportion of the entire nitride semiconductor laminated structure 2 occupied by the merging portions 18 is larger than the proportion of the entire nitride semiconductor laminated structure 2 occupied by the merging portions 11 in the first embodiment. Also inside the intrinsic GaN layer 3 at the respective merging portions 11 and 18, the two-dimensional electron gas 9 is distributed across substantially the entire vicinity of the semiconductor layer interface 8. Thus, the larger the proportion of the entire nitride semiconductor laminated structure 2 occupied by the merging portions, the larger the distribution range of the two-dimensional electron gas 9. With an configuration with a large range of distribution of the two-dimensional electron gas 9 as in the second embodiment, an on resistance of the HEMT can be reduced further and thus an even better HEMT can be realized.

As described above, the embodiments of the present invention are described, and the present invention can further be implemented by another embodiment.

For example, although the above-described embodiments have configurations where the gate insulating film 12 is interposed between the gate electrode 13 and the nitride semiconductor laminated structure 2, for example, the gate electrode 13 may be formed directly on the surface of the nitride semiconductor laminated film 2 without using the gate insulating film 12. In this case, the gate electrode 13 is preferably arranged to have a laminated structure of Ni/Au (lower layer/upper layer). When the lower layer of the gate electrode 13 is Ni, the gate electrode 13 can be formed to be in good Schottky junction with the n-type AlGaN layer 4.

Also, although with the above-described embodiments, it is described that the nitride semiconductor laminated structure 2 is a Group III nitride semiconductor laminated structure constituted of the intrinsic GaN layer 3 and the n-type AlGaN layer 4, the nitride semiconductor laminated structure 2 may be arranged as a laminated structure using other Group III nitride semiconductors.

Also, although the intrinsic GaN layer 3 that does not contain any dopants is employed as the layer in the nitride semiconductor laminated structure 2 in which the two-dimensional electron gas is formed, a semiconductor layer that contains a dopant may be employed instead. However with the HEMT according to the present invention, the semiconductor layer in which the carrier (two-dimensional electron gas) is formed is preferably an intrinsic semiconductor that does not contain any dopants. With an intrinsic semiconductor, the mobility of the carrier (two-dimensional electron gas) can be improved.

Although the gate electrode 13 has the electrode bottom portions 131, the electrode side portions 132, and the electrode top portions 133, another configuration may be employed as long it is a configuration that can realize a normally-off operation. For example, the gate electrode 13 may have just the electrode side portions 132 or have the electrode side portions 132 and the electrode top portions 133. However, preferably with the HEMT according to the present invention, the gate electrode 13 has the electrode bottom portions 131, the electrode side portions 132, and the electrode top portions 133 and these portions are formed continuously. With such a configuration, the gate electrode 13 can be formed readily.

Also although with the above-described embodiments the composition of Al in the n-type AlGaN layer 4 is not described in particular detail, with the n-type AlGaN layer 4, the composition of Al in the interior may be uniform or portions that differ in Al composition may be distributed. Also with the HEMT according to the present invention, a plurality of n-type AlGaN layers of different Al compositions may be laminated in place of the n-type AlGaN layer 4.

Furthermore, although the above-mentioned embodiments describe that the intrinsic GaN layer 3 is disposed as the first layer of the present invention, the HEMT according to the embodiment of the present invention may be configured with a Group III nitride semiconductor layer made of a mixed crystal of AlInGaN in place of the intrinsic GaN layer 3.

Furthermore, although the above-mentioned embodiments describe that the plurality of line-like portions 10 and the line-like portions 17 are formed, the HEMT according to the embodiment of the present invention may be configured with a single line-like portion.

Furthermore, although the above-mentioned embodiments describe that the plurality of line-like portions 10 and the line-like portions 17 are merged at the merging portions 11 and the merging portions 17, respectively, a source electrode connection portion at one end of each line-like portion may be connected to the source electrode, and a drain electrode connection portion at the other end of each line-like portion may be connected to the drain electrode.

Although the embodiments of the present invention are described in detail, these embodiments are merely specific examples used for clarifying the technical contents of the present invention. Therefore, the present invention should not be construed as being limited in any way to these specific examples. The spirit and scope of the present invention are limited only by the scope of the appended claims.

This application corresponds to Japanese Patent Application No. 2007-156458 filed with the Japanese Patent Office on Jun. 13, 2007, the full disclosure of which is incorporated herein by reference.

What is claimed is:

1. A nitride semiconductor device comprising:
    a nitride semiconductor laminated structure comprising a first layer made of a Group III nitride semiconductor, a second layer laminated on the first layer and made of an Al-containing Group III nitride semiconductor with a composition that differs from that of the first layer, the nitride semiconductor laminated structure comprising a stripe-like trench exposing a lamination boundary between the first layer and the second layer;
    a gate electrode formed to oppose the lamination boundary; and
    a source electrode and a drain electrode, having the gate electrode interposed therebetween, each connected electrically to the second layer.

2. The nitride semiconductor device according to claim 1, wherein
    a plurality of the trenches are formed in the nitride semiconductor laminated structure and an interval between mutually adjacent trenches is 50 nm or less.

3. The nitride semiconductor device according to claim 1, wherein
    an insulating film is interposed between the gate electrode and the nitride semiconductor laminated structure.

4. The nitride semiconductor device according to claim 3, wherein
    the insulating film is an SiN film.

5. The nitride semiconductor device according to claim 1, wherein
    a width of the trench in the stripe direction is narrower than a width of the gate electrode in the stripe direction.

6. A nitride semiconductor device comprising:
    a line like portion comprising a first layer made of a Group III nitride semiconductor, a second layer laminated on the first layer and made of an Al-containing Group III nitride semiconductor with a composition that differs from that of the first layer;
    a source electrode connection portion provided at one end of the line like portion;
    a drain electrode connection portion provided at the other end of the line like portion;
    a gate electrode provided for covering a part of the line like portion including at least a lamination boundary between the first layer and the second layer.

7. The nitride semiconductor device according to claim 6, wherein
    a width being orthogonal to a longitudinal direction of the line like portion is 50 nm or less.

8. The nitride semiconductor device according to claim 6, wherein
    an insulating film is interposed between the gate electrode and the line like portion.

9. The nitride semiconductor device according to claim 6, wherein
    the line like portion includes a plurality of line like portions in stripes,
    the source electrode connection portion is a source-side merging portion spanning across the plurality of line-like portions along a width direction orthogonal to a longitudinal direction of the line like portions at one ends of the line like portions,
    the drain electrode connection portion is a drain-side merging portion spanning across the line like portions along the width direction at other ends of the line like portions.

* * * * *